(12) United States Patent
Tsujimura et al.

(10) Patent No.: US 6,653,178 B2
(45) Date of Patent: Nov. 25, 2003

(54) THIN FILM TRANSISTOR AND METHOD FOR MANUFACTURING THE SAME

(75) Inventors: Takatoshi Tsujimura, Fujisawa (JP); Taroh Hasumi, Machida (JP); Osamu Tokuhiro, Shiga-ken (JP); Mitsuo Morooka, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/061,578

(22) Filed: Jan. 31, 2002

(65) Prior Publication Data

US 2002/0106839 A1 Aug. 8, 2002

(30) Foreign Application Priority Data

Feb. 2, 2001 (JP) ......................................... 2001-027029

(51) Int. Cl.[7] ............................................. H01L 29/786
(52) U.S. Cl. ..................... 438/158; 438/161; 438/749
(58) Field of Search ........................... 438/38, 40, 128, 438/129, 584, 587, 597, 598, 620, 637, 638, 640, 645, 689, 698, 701, 149, 671, 42, 43; 257/673; 349/43; 216/11, 38, 96; 43/158, 749, 751, 161

(56) References Cited

U.S. PATENT DOCUMENTS

| 3,808,069 | A | * | 4/1974 | Caffrey et al. | ............. | 438/701 |
|---|---|---|---|---|---|---|
| 6,001,541 | A | * | 12/1999 | Iyer | ............................. | 430/322 |
| 6,337,723 | B1 | * | 1/2002 | Bae | ............................. | 438/149 |
| 6,348,367 | B1 | * | 2/2002 | Ohtani et al. | ............... | 438/151 |
| 6,444,574 | B1 | * | 9/2002 | Chu | ............................. | 438/638 |
| 6,465,285 | B2 | * | 10/2002 | Tokuhiro et al. | ........... | 438/153 |
| 6,466,279 | B1 | * | 10/2002 | Nakata | ........................ | 252/500 |
| 2002/0084475 | A1 | * | 7/2002 | Ho Moon | ..................... | 257/247 |

FOREIGN PATENT DOCUMENTS

| JP | 07-056190 | * | 3/1995 | ......... H01L/29/786 |
|---|---|---|---|---|
| JP | 10170951 A | * | 6/1998 | ........... G02F/1/136 |
| JP | 10-170951 | | 6/1998 | ........... G02F/1/136 |
| JP | 11-283934 | | 10/1999 | ........... H01L/21/28 |
| JP | 2000-294795 | * | 10/2000 | ............. H01L/29/78 |

* cited by examiner

*Primary Examiner*—Wael Fahmy
*Assistant Examiner*—Anh Duy Mai
(74) *Attorney, Agent, or Firm*—Ira D. Blecker

(57) ABSTRACT

A thin film transistor and method of making the same is disclosed in which a contact hole is formed with a flattened interface between openings in an inorganic material passivation layer and an organic material interlayer insulating film thereabove. The method includes etching an opening in the interlayer insulating film, using that opening as a mask for subsequently etching a self-aligned opening in the passivation layer, and again etching the interlayer insulating film in a develop back process to obtain a contact hole having a flattened inner sidewall.

10 Claims, 10 Drawing Sheets

THIN FILM TRANSISTOR AND METHOD FOR MANUFACTURING THE SAME

FIELD OF THE INVENTION

The present invention relates to a thin film transistor and method for making the same, and more specifically to a method for fabricating a thin film transistor of the type in which an electrode is placed over a surface formed by a plurality of insulating films.

BACKGROUND OF THE INVENTION

Thin film transistors (hereinafter referred to as a TFTs) are lightweight, have little thickness, and are advantageous for low power applications. Accordingly, TFTs have been widely used in such products as active matrix type liquid crystal displays (LCDs), organic electroluminescence displays and image sensors.

Various structural modifications have been proposed to further improve the characteristics of TFTs. For example, in a polymer film on array (hereinafter referred to as a PFA) structure, electrically conductive pixel electrodes (made of a material such as indium tin oxide (ITO)) overlap data lines. Such structure prevents electric fields from being applied in a lateral direction to liquid crystal molecules at the ITO electrodes. As a result, disclination lines are confined to data line regions, which may help increase the aperture ratio of the display device.

FIGS. 10(a) to 10(f) show conventional manufacturing process steps for manufacturing a TFT including the above-described PFA structure. As shown in FIG. 10(a), a gate electrode 2 is formed on an insulating substrate 1 of glass composition, for example, by the use of a proper patterning process (a first photo-engraving process; hereinafter referred to as a "PEP"). Subsequently, the process advances to a step shown in FIG. 10(b) in which a gate insulating film 3 and a semiconductor layer 4 are deposited on the substrate 1 and the gate electrode 2. In FIG. 10(b), a channel protection film 5 is deposited subsequently, and the channel protection film 5 is subjected to patterning by an appropriate patterning process (second PEP).

The process advances to a step shown in FIG. 10(c), in which electrode material such as Al, Mo, Ta and W is deposited. Thereafter, the electrode material is subjected to patterning, thereby forming a source electrode 6 and a drain electrode 7 (third PEP). Thereafter, a passivation layer 8 is deposited on the surface of the resultant structure, and the passivation layer 8 is subjected to patterning as shown in FIG. 10(d) (fourth PEP). Moreover, an interlayer insulating film 9 is coated on the patterned structure and etching is performed as shown in FIG. 10(e), thereby forming an opening 10 for forming a contact hole (fifth PEP).

Furthermore, an ITO film is deposited and the ITO film is subjected to patterning, thus forming a pixel electrode 11 and a contact hole 12 (sixth PEP) as shown in FIG. 10(f). As described above, though the TFT including PFA can increase an aperture ratio of the pixel electrode 11, the excessive patterning process in which the structure for forming the contact hole 12 through PFA is formed is added to all of the steps of manufacturing the TFT. This leads to an increase in cost to manufacture the TFT including PFA.

Various methods have been proposed to solve such a problem until now. For example, Japanese Laid-Open Patent Application No. 10-170951 (1998), describes a method of manufacturing a liquid crystal display including a step for forming a contact hole in an inorganic insulating film. As described, the contact hole is formed in the inorganic insulating film in self-alignment with a contact hole formed in an interlayer insulating film of organic material which is used as a mask. Therefore, the contact hole is formed in the inorganic insulating film without deviating from the contact hole formed in the interlayer insulating film. Specifically, the precise placement of the contact hole is called a self-alignment property, and the self-alignment property of the contact hole is improved by etching the inorganic insulating film by the use of the interlayer insulating film as a resist layer. However, an end of the inorganic insulating film is overetched more inwardly than an inner wall of the contact hole in many cases, thus forming a step interface.

At such step interface, the overlaid pixel electrode jogs, and may even be trimmed down or cut where it crosses the step interface. Consequently, the pixel electrode may exhibit poor electrical contact, and so-called point defects are likely to occur. In order to prevent such cutting of the pixel electrode, a post-baking step may be performed on the interlayer insulating film, which may help to planarize the interface between the interlayer insulating film and the passivation layer. However, such additional process step adds to manufacturing complexity and the cost of manufacturing the TFT. Moreover, the post-baking step requires the organic interlayer insulating film to be heated to a sufficiently high temperature that causes the interlayer insulating film to shrink. As a result, optical properties of the interlayer insulating film may deteriorate.

Further, Japanese Laid-Open Patent Application No. 11-283934 (1998) describes another method of manufacturing a TFT. As described, an opening for a contact hole is formed in an interlayer insulating film. Then a passivation layer is etched in self-alignment with the contact hole in the interlayer insulating film. As described, resistivity through the contact hole and the pixel electrode is decreased. However, a step results between the interlayer insulating film and the passivation layer, which may lead to a point defect at the step. Another problem is that etching of the passivation layer has poor selectivity which may lead to overetch of the underlying drain electrode. Unless etch conditions are perfectly controlled, such overetch may render some drain electrodes inoperative in a large TFT array (e.g. a display).

By contrast to the above-described conventional TFT and methods of manufacturing TFTs, the inventors of the present invention have investigated a novel device and processing method which may reduce defects heretofore resulting from the TFT having a step interface between an interlayer insulating film and a passivation layer.

SUMMARY OF THE INVENTION

According to an embodiment of the present invention, the interlayer insulating film is etched more than once. Accordingly, a method is provided for manufacturing a thin film transistor, the thin film transistor having a gate electrode, a gate insulating film, a semiconductor layer, a source electrode and a drain electrode, a passivation layer in which a first opening is formed, and an interlayer insulating film over said passivation layer in which a second opening is formed, wherein the first opening is self-aligned to said second opening, and wherein the method comprises flattening an interface between the first opening and the second opening by etching the interlayer insulating film after etching the first opening.

Preferably, the first etching process (by which the first opening is formed in the passivation layer) is performed with etchant containing hydrofluoric acid, while the second etching process (by which the interface is flattened) is preferably performed with an etchant selected from a group consisting of sodium hydroxide, potassium hydroxide, ammonium hydroxide, tetramethyl ammonium hydroxide, tetra-n-butyl ammonium hydroxide, methyl alcohol, ethyl alcohol, isopropyl alcohol, and a mixture made of these materials. Also, preferably, the inner side wall of the first and second openings forming the contact hole includes a derivative of the basic etchant. Moreover, the TFT of the present invention can preferably be constructed as a bottom gate type TFT or a top gate type TFT.

Preferably, the first etching process can use an acid etchant, and the second etching process can use a basic etchant or a solvent. Furthermore, the first etching process can preferably use an etchant containing hydrofluoric acid, and the second etching process can preferably use a etchant selected from a group consisting of sodium hydroxide, potassium hydroxide, ammonium hydroxide, tetramethyl ammonium hydroxide, tetra-n-butyl ammonium hydroxide, methyl alcohol, ethyl alcohol, isopropyl alcohol, and a mixture made of these materials. Such method may preferably result in a bottom gate type TFT or a top gate type TFT. Preferably, the interlayer insulating film can be made of photoresist.

A TFT according to an embodiment of the invention includes a gate electrode; a gate insulating film; a semiconductor layer; a source/drain electrode; a passivation layer in which a first opening for forming a contact hole is formed; and an interlayer insulating film extending along the passivation layer, in which a second opening for forming the contact hole is formed, wherein the first and second openings are formed so as to be self-aligned with each other, a conductive layer is deposited on an inner side wall of the contact hole, and the inner side wall is formed by performing a plurality of different etching processes in which the inner side wall of the contact hole has been relatively flattened.

Preferably, the interlayer insulating film is selected from thermoplastic resin, thermosetting resin, photosensitive resin and a mixture of these resins. Preferably, the plurality of different etching processes include a process for etching the interlayer insulating film, a first etching process for etching the passivation layer and a second etching process for smoothing the inner side wall by performing a develop back for the interlayer insulating film. The first etching process may preferably use an acid etchant, and the second etching process can use a basic etchant or a solvent.

BRIEF DESCRIPTION OF THE DRAWINGS

The following description of the invention is best understood with reference to the appended drawings, which are identified as follows.

DETAILED DESCRIPTION OF THE PREFERRED EMBODIMENTS

Figure 1:
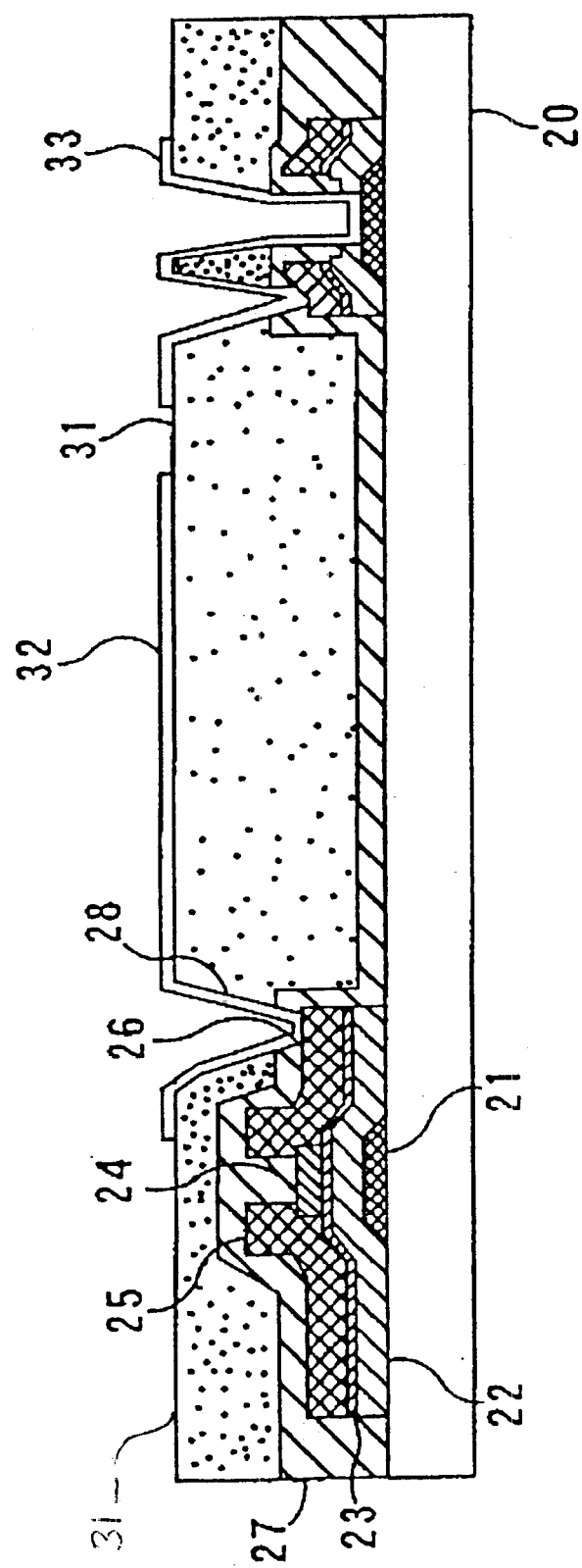
FIG. 1 is a section view of a TFT of the present invention.

FIG. 1 shows a partial section view of a TFT of the present invention. The TFT shown in FIG. 1 is constructed by laminating a plurality of layers on a substrate of glass, metal oxide, a ceramic, a single crystal silicon, or any other suitably insulating substrate. To be specific, the TFT shown in FIG. 1 should be preferably constructed by laminating the plurality of layers on the insulating substrate 20 in an embodiment in which the present invention is applied to a TFT used for a liquid crystal display. In the embodiment shown in FIG. 1, the TFT is formed in such a manner that a gate electrode 21 is deposited on the substrate 20 by the use of physical and chemical deposition methods such as sputtering, vacuum deposition and CVD, followed by patterning. In the present invention, the gate electrode 21 is formed of a material selected from a group consisting of Al, Mo, Ti, Ta, Ni and alloys of such metals.

With reference to the FIG. 1 showing the completed TFT and FIGS. 2–7 which show steps in its manufacture, the construction of the TFT will now be described.

Figure 2:
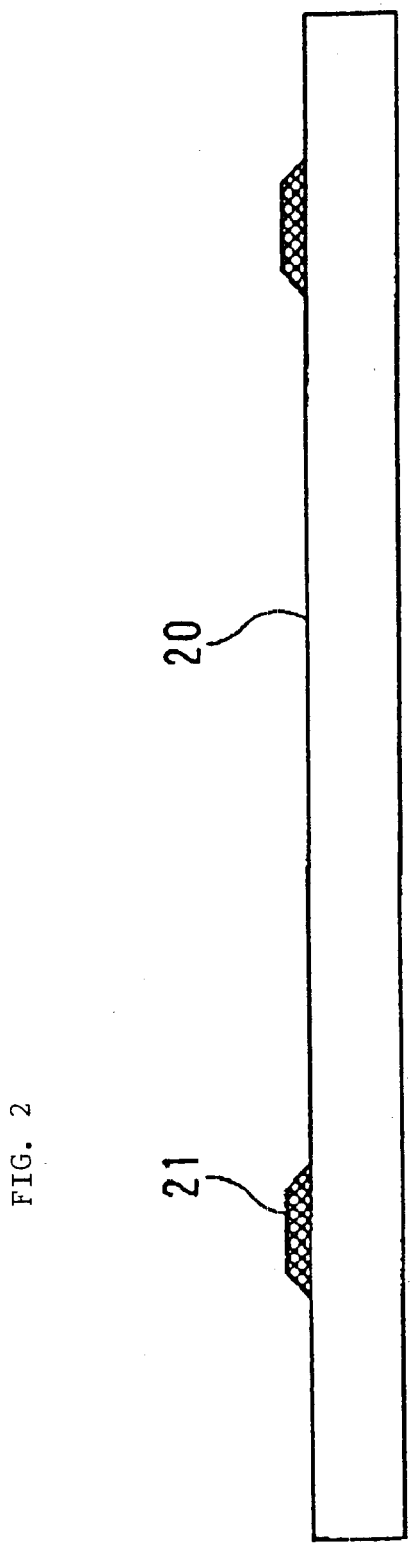
FIG. 2 is a drawing showing a structure formed by a first patterning process used in the present invention.

As illustrated in FIG. 2, the gate insulating film 22 is deposited on the substrate 20 and the gate electrode 21 typically to a thickness of several hundreds nanometers and preferably ranging between about 300 nm and about 500 nm. As long as an allowable insulating property of the gate insulating film 22 can be obtained, the gate insulating film 22 can be formed of an insulating material such as silicon nitride (SiNx), silicon oxynitride (SiOxNy) and/or silicon oxide (SiOx) (x, y: positive integers) for which a deposition method such as chemical vapor deposition or a physical vapor deposition is used.

Figure 3:
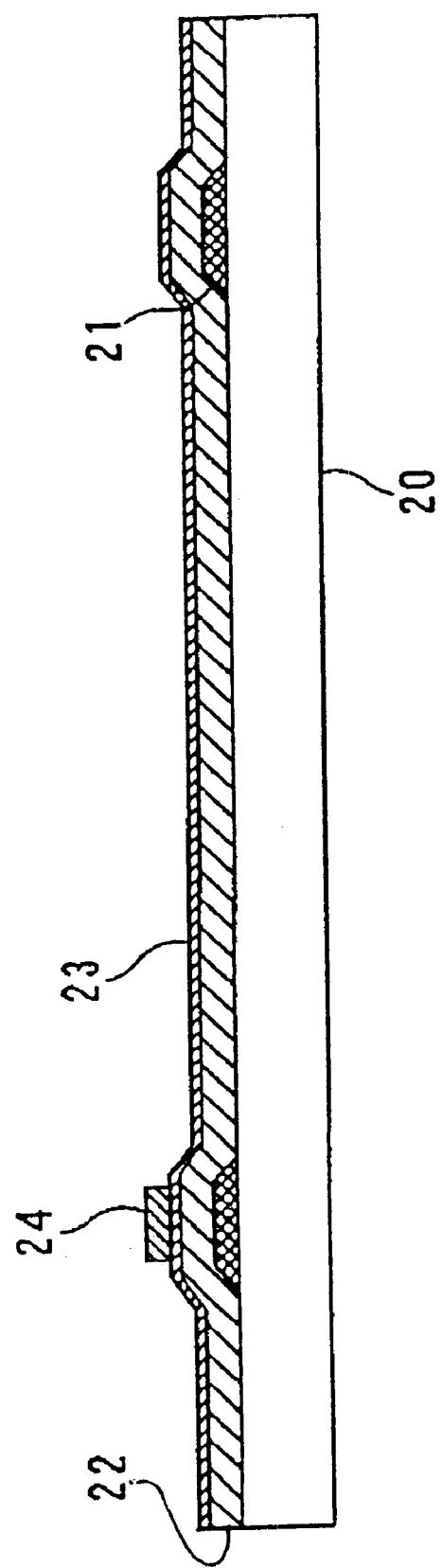
FIG. 3 is a drawing showing a state in which a gate insulating film and a semiconductor layer are deposited and then a channel protection film is deposited and patterned on the semiconductor layer.

As shown in FIG. 3, semiconductor layer 23 is deposited on the gate insulating film 22 by a suitable deposition method such as plasma CVD to a thickness of 300 nm or less, preferably to a thickness ranging between about 30 nm and about 50 nm. Such semiconductor layer 23 includes the transistor channel which enables a switching operation of the TFT. As the semiconductor layer 23, non-doped polycrystalline silicon or non-doped amorphous silicon (a-Si) can be used. When polycrystalline silicon is used, amorphous silicon can be deposited, followed by a suitable crystallization process.

A channel protection film 24 is deposited on the semiconductor layer 23, and protects the semiconductor layer 23 from ion-injection. The channel protection film 24 functions also as an etching protection film. The channel protection film 24 can be selected from any suitable material such as SiNx. However, in the present invention, the material of the channel protection film 24 is not limited to SiNx, and any other materials such as SiNxOy, SiOx (x, y being integer numbers), which are known suitable to those skilled in the art, can be used for the channel protection film 24.

Figure 4:
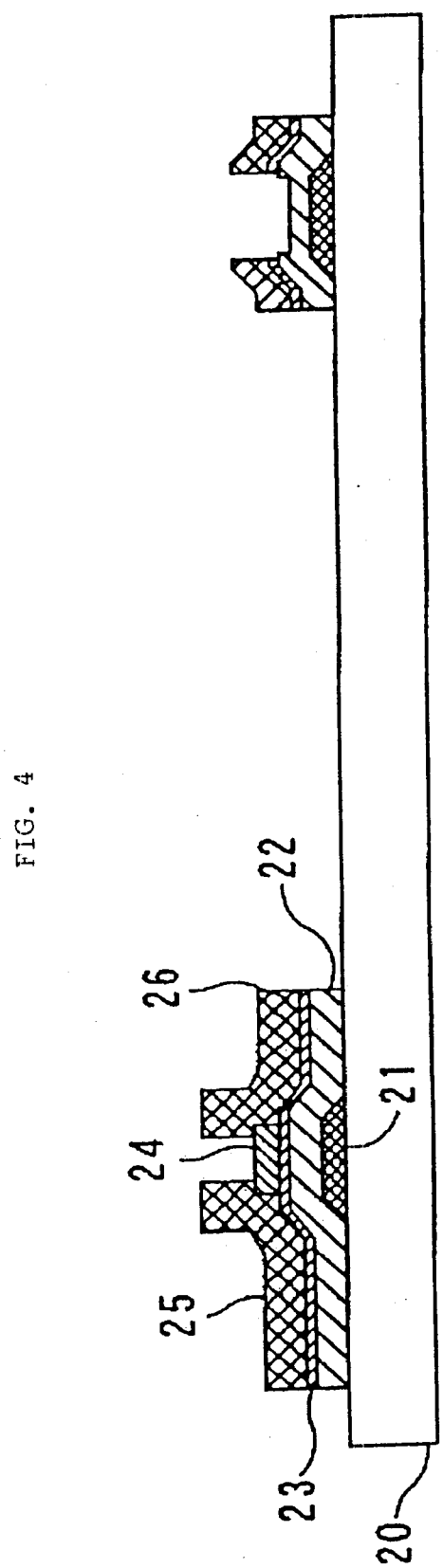
FIG. 4 is a drawing showing a state in which a source electrode and a drain electrode are deposited and patterned.

Next, as shown in FIG. 4, source electrode 25 and a drain electrode 26 made of a metal or an alloy are formed on a contact layer (not shown). Suitable metals for forming the source electrode 25 and the drain electrode 26 are any of Al, Mo, Ti, Ta, Cr and any alloys of such metals.

As further shown in FIG. 1, a passivation layer 27 is deposited so as to cover the layers formed thereunder except for a contact hole 28 formed at a position corresponding to the drain electrode 26. The passivation layer 27 used in the present invention can be formed of any insulating inorganic film. The passivation layer 27 is preferably formed of a silicon compound such as SiNx, SiNxOy and SiOx.

In the embodiment of the TFT of the present invention shown in FIG. 1, polymer resin is coated on the passivation layer 27, and this polymer resin forms an interlayer insulating film 31. An opening for forming the contact hole 28 that reaches the drain electrode 26 is formed by etching the interlayer insulating film 31. The opening in the interlayer insulating film 31 and the opening in the passivation layer 27 are formed in self-alignment with each other, so as to form contact hole 28 without a step interface between passivation layer 27 and interlayer insulating film 31. In the present invention, the contact hole 28 is formed by the use of a plurality of different etching processes in which the passivation layer 27 is isotropically etched, using the interlayer insulating film 31 as a mask, and then the interlayer insulating film 31 is isotropically etched a second time using an etchant different from the one used for etching the passivation layer 27.

In the TFT shown in FIG. 1, a pixel electrode 32 and a contact electrode 33 are formed of a transparent conductive material such as ITO (indium tin oxide), ATO (antimony tin oxide), IZO (indium zinc oxide), and $SnO_2$ (tin oxide). In such manner, a pixel electrode 32 is obtained which exhibits good electrical contact by virtue of the flattened surface of the contact hole 28 which was formed in the above-described manner.

The method of manufacturing the TFT of the present invention will now be described in greater process detail, with reference to FIG. 2 through FIG. 7. FIG. 2 is a drawing showing a structure formed by a first patterning process used in the present invention. As shown in FIG. 2, patterning is performed to form a desired pattern by a suitable patterning process including steps of depositing the gate electrode 21 on the substrate 20, coating photoresist, patterning the photoresist and etching the gate material. Thereafter, the photoresist is stripped, and the gate electrode 21 is exposed, thus forming the gate electrode 21 (first PEP).

In the process of the present invention, as shown in FIG. 3, the gate insulating film 22 and the semiconductor layer 23 are sequentially deposited. Subsequently, the channel protection film 24 is deposited on the semiconductor layer 23, and then patterning is performed to form a desired structure as shown in FIG. 3 (second PEP).

Subsequently, as shown in FIG. 4, the source electrode 25 and the drain electrode 26 are deposited on the semiconductor layer 23, and are then patterned (third PEP). At this time, a contact layer such as a $N^+$ a-Si or a $P^+$ a-Si (not shown) is formed between the semiconductor layer 23 and the source/drain electrodes 25 and 26 respectively by the use of a method such as an ion-injection method, thus obtaining an ohmic contact.

Figure 5:
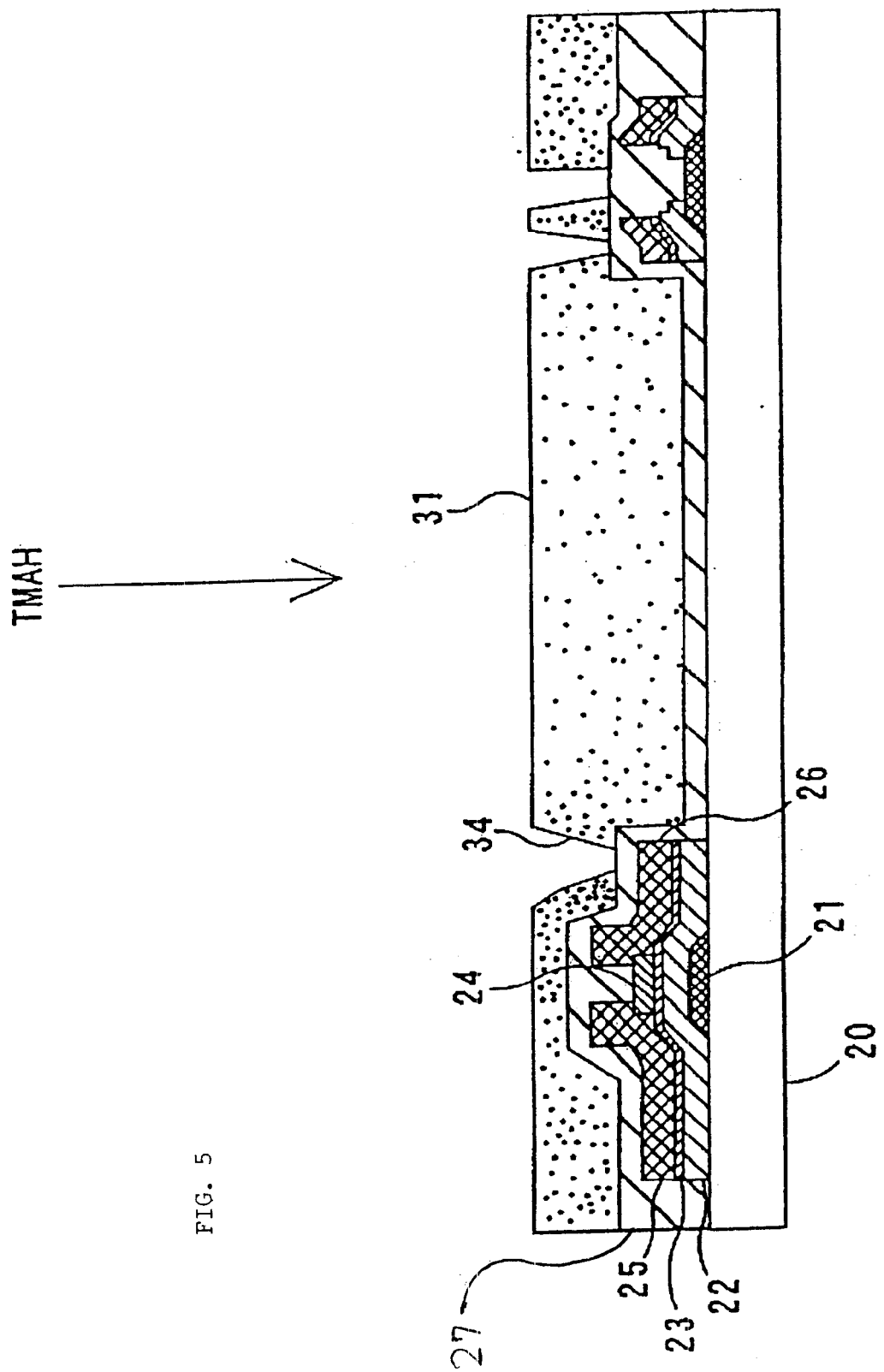
FIG. 5 is a drawing showing formation of a passivation layer and an interlayer insulating film.

Moreover, as shown in FIG. 5, the passivation layer 27 made of SiNx is deposited in the method of manufacturing the TFT of the present invention. Thereafter, polymer resin is coated on the passivation layer 27, and the polymer resin is patterned by the use of a suitable patterning process, thus forming the interlayer insulating film 31 having an opening 34 for forming the contact hole 28. When thermoplastic resin is used as the interlayer insulating film, the patterning process to form the opening therein comprises the following steps described below. Specifically, photoresist is coated on the polymer resin by the use of suitable coating means such as a spin coater after coating the polymer resin. Thereafter the photoresist is exposed to a pattern shape by a photomask, and then etching is performed by using suitable etchant such as tetramethyl ammonium hydroxide (TMAH), thus forming the opening 34 in the polymer resin. Thereafter, the photoresist is removed by a stripper (fourth PEP).

When thermosetting resin is used as the interlayer insulating film 31 in the present invention, the opening can be formed by applying the foregoing patterning process to the thermosetting resin after coating but before curing the thermosetting resin.

Alternatively, photosensitive polymer or photosensitive resin composition having photosensitivity to radiation is used as the interlayer insulating film 31. In such way, manufacturing steps can be eliminated including steps for depositing a photoresist over the polymer resin, patterning the photoresist and the subsequent step of stripping the photoresist. Accordingly, the number of the manufacturing steps can be reduced, thereby reducing the manufacturing cost of the TFT.

For use as the photosensitive resin or the photosensitive resin composition, either a positive sensitivity composition or negative sensitivity composition can be used. Preferably, a photosensitive resin or photosensitive resin composition is selected which is not affected by the etchant used for etching the passivation layer 27. This will be more favorable to the develop back method used to form the contact hole 28, as will be described later.

In the present invention, the passivation layer 27 is preferably formed of an inorganic insulating film such as SiNx, SiNxOy or SiOx. Therefore, an etchant containing hydrofluoric acid can be used, for example. Preferably a buffer solution of hydrofluoric acid ($HF+NH_4F$) is used.

From the viewpoint of such circumstances, in the present invention, though resin used for the interlayer insulating film 31 may be thermoplastic resin, thermosetting resin, photosensitive resin or photosensitive resin composition, it must not be soluble in acid but must be soluble in basic etchant and basic solvent. Various kinds of resin can be enumerated which are soluble in basic etchant. Enumerated are novolac resin having phenolic hydroxyl group and these derivatives; polyacrylate or polymethacrylate containing one of acrylic acid and methacrylic acid; copolymer formed of styrene and acrylate or formed of styrene and methacrylate; copolymer formed of polyhydroxystyrene, acrylic acid, one of acrylic acid ester and methacrylic acid, methacrylic acid ester and hydroxystyrene; and poly-alkoxystyrene.

As a photosensitive resin composition, photoresist can be used. For example, a photoresist can be used in which a solubility modifier such as diazo-naphthoquinone-diazide derivative is mixed with resin such as novolac resin containing phenolic hydroxyl group to increase solubility. Photosensitive resin composition can also be used having an acid generating agent which is responsive to radiation. Such composition will also include a polymerizing compound containing unsaturated double bonding such as polyacrylate, polymethacrylate, acrylate (methacrylate)-styrene copolymer, polyhydroxystyrene, poly (p-alkoxystyrene). Furthermore, as the photosensitive resin composition, it is also possible to employ negative-type photosensitive resin composition obtained by appropriately adding acrylic monomer and the like to acrylic resin and by adding initiator enabling photopolymerization to this resin. As the thermosetting resin, epoxy resin, acrylic resin, and resin obtained by mixing acrylic monomer to acrylic resin can be used.

Figure 6:
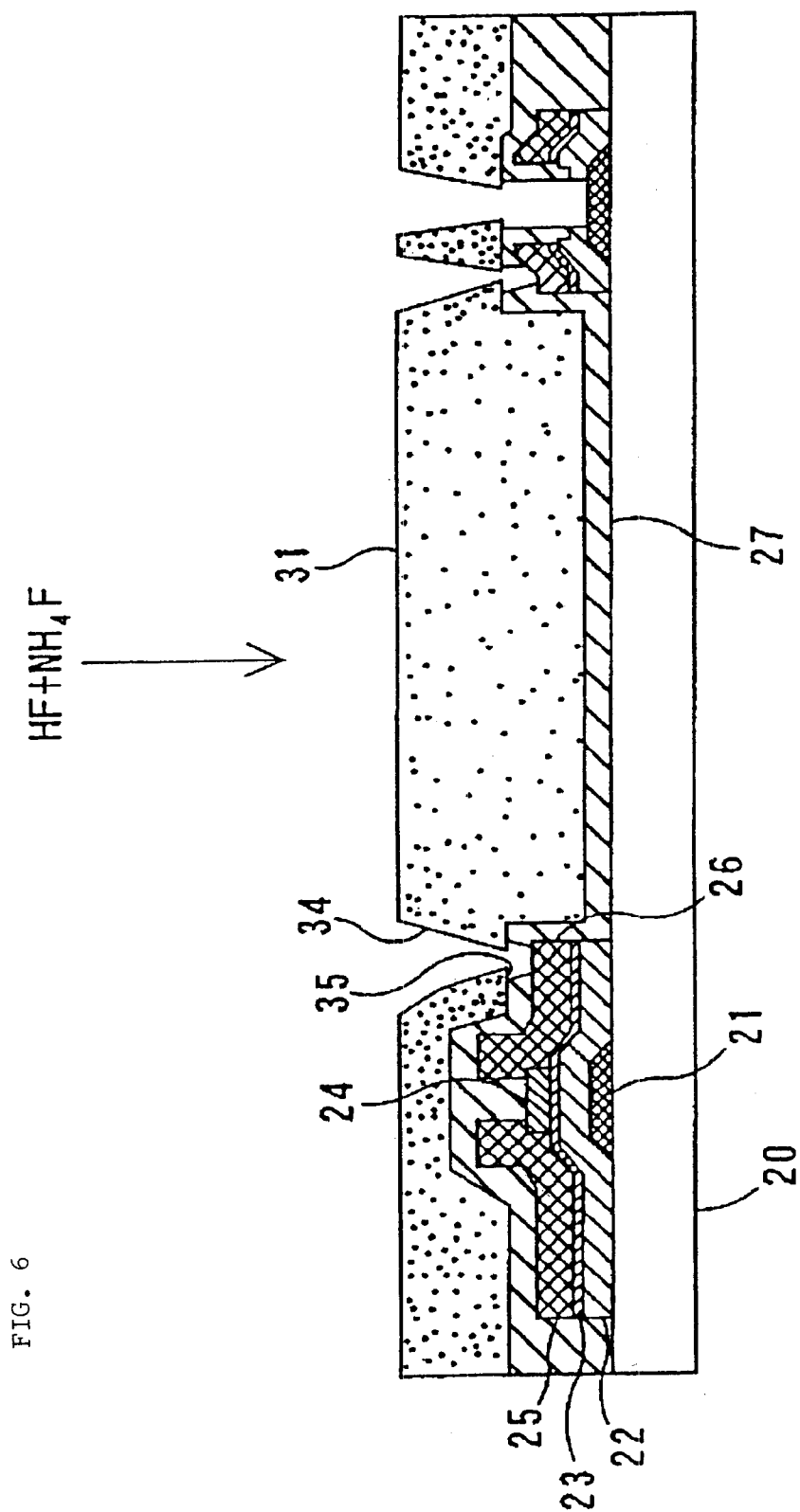
FIG. 6 is a drawing showing an overhang after the passivation layer is isotropically etched by buffer hydrofluoric aqueous solution.

FIG. 6 is a drawing for explaining the first etching process in a contact hole formation step of the present invention in detail. As described above, the contact hole 28 of the present invention is formed by use of a plurality of etching processes so that the respective openings formed in the interlayer insulating film 31 and the passivation layer 27 form a continuously flat inner side wall of the contact hole 28. First, by the process described in FIG. 5, the opening 34 is formed so as to correspond to the position where the contact hole 28 is formed in the interlayer insulating film 31. Subsequently, as shown in FIG. 6, the passivation layer 27 is etched isotropically by wet etching using the interlayer insulating film 31 as a mask.

This etching of the passivation layer 27 is preferably performed by contacting the substrate 20 with an acid etchant in an etchant bath. Acid etchant, for example, hydrofluoric acid or buffer hydrofluoric acid, which is capable of dissolving the passivation layer 27, can be used in this step. In the present invention, the acid etchant means etchant showing an acid nature when this etchant takes the form of aqueous solution. To acquire a proper development rate, it is especially preferable to employ buffer hydrofluoric acid (HF+NH$_4$F). A concentration of the buffer hydrofluoric acid can be selected so that a desirable etching rate is obtained.

When the passivation layer 27 is isotropically etched by the buffer hydrofluoric acid solution in the etching process shown in FIG. 6, etching simultaneously progresses not only in a depth direction of the passivation layer 27 but also laterally. For this reason, an end portion of the passivation layer 27 is eroded toward the inside of an end portion of the interlayer insulating film 31, and the interlayer insulating film 31 forms an overhang 35. Since the overhang 35 formed in the interlayer insulating film 31 gives a step structure, a deposition defect due to the step structure occurs in depositing the pixel electrode 32 and the contact electrode 33 to be described later. If such overhang 35 is not removed, such electrodes may exhibit poor conductivity and be defective.

In the present invention, the overhang 35 is removed by performing a further etching step. In such etching step, a develop back process is performed by the use of a basic etchant such as TMAH (tetramethylammonium hydroxide) (solvent) which etches only the interlayer insulating film 31. Etching of interlayer insulating film 31 is performed with the basic etchant whereby overhang 35 is removed reliably in a manner that does not cause deterioration of the interlayer insulating film 31.

Figure 7:
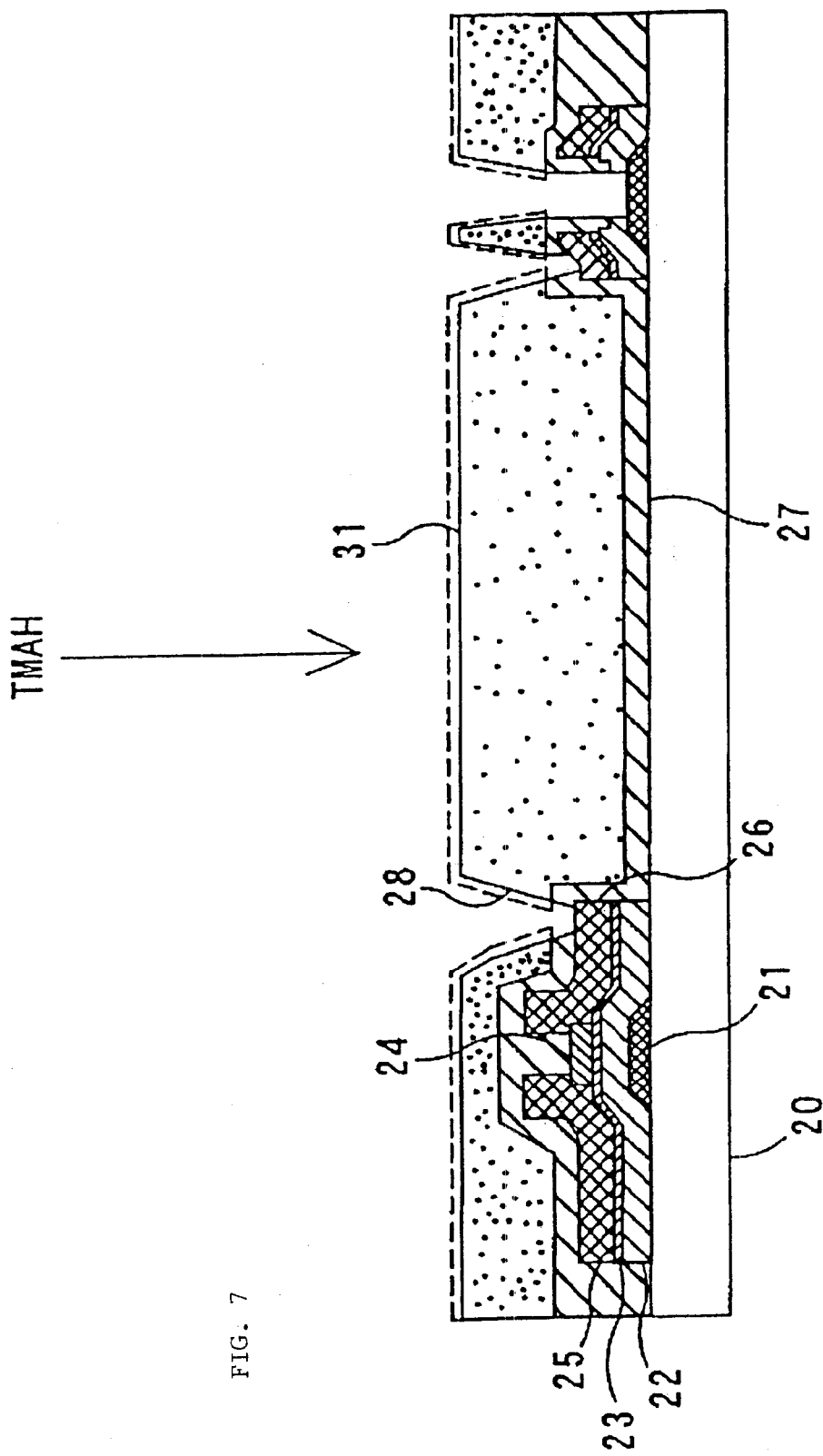
FIG. 7 is a section view showing a contact hole after performing the etching in accordance with a second etching process (develop back).

FIG. 7 is a partial section view showing the TFT after the second etch of interlayer insulating film 31 to remove overhang 35. Furthermore, in the present invention, to perform a suitable develop back, it is possible to use an etchant such as solvent other than TMAH. The opening 34 is developed back by the second etching process in the present invention, and the inner wall of the opening 34 of the interlayer insulating film 31 that has been developed back and the inner wall of the opening of the passivation layer 27 form a continuously flat plane, that is, the continuously flat inner side wall of the contact hole 28. In FIG. 7, the portion of the interlayer insulating film 31 that has been developed back is shown by the dotted lines.

As the basic etchant that can be used for the second etching process shown in FIG. 7, the etchant obtained by dissolving organic or inorganic compound into water, which shows alkaline nature when it takes the form of aqueous solution, can be mentioned. To be concrete, as the basic etchant, sodium hydroxide, potassium hydroxide, ammonium hydroxide, tetramethyl ammonium hydroxide, tetra-n-butyl ammonium hydroxide and mixture made of these materials can be mentioned. Also the above-described second etching process can be performed in such a manner that the etchant is reserved in an etching bath, and then the substrate 20 is dipped in the etchant.

Thereafter, in the manufacturing method of the present invention, deposition and formation of the pixel electrode 32 and the contact electrode 33 are performed. The pixel electrode 32 and the contact electrode 33 can be formed of a transparent conductive material such as ITO, IZO, ATO and SnO$_2$. Furthermore, it is possible to deposit and pattern the pixel electrode 32 and the contact electrode 33 by any suitable deposition methods and etching method (fifth PEP).

Figure 8:
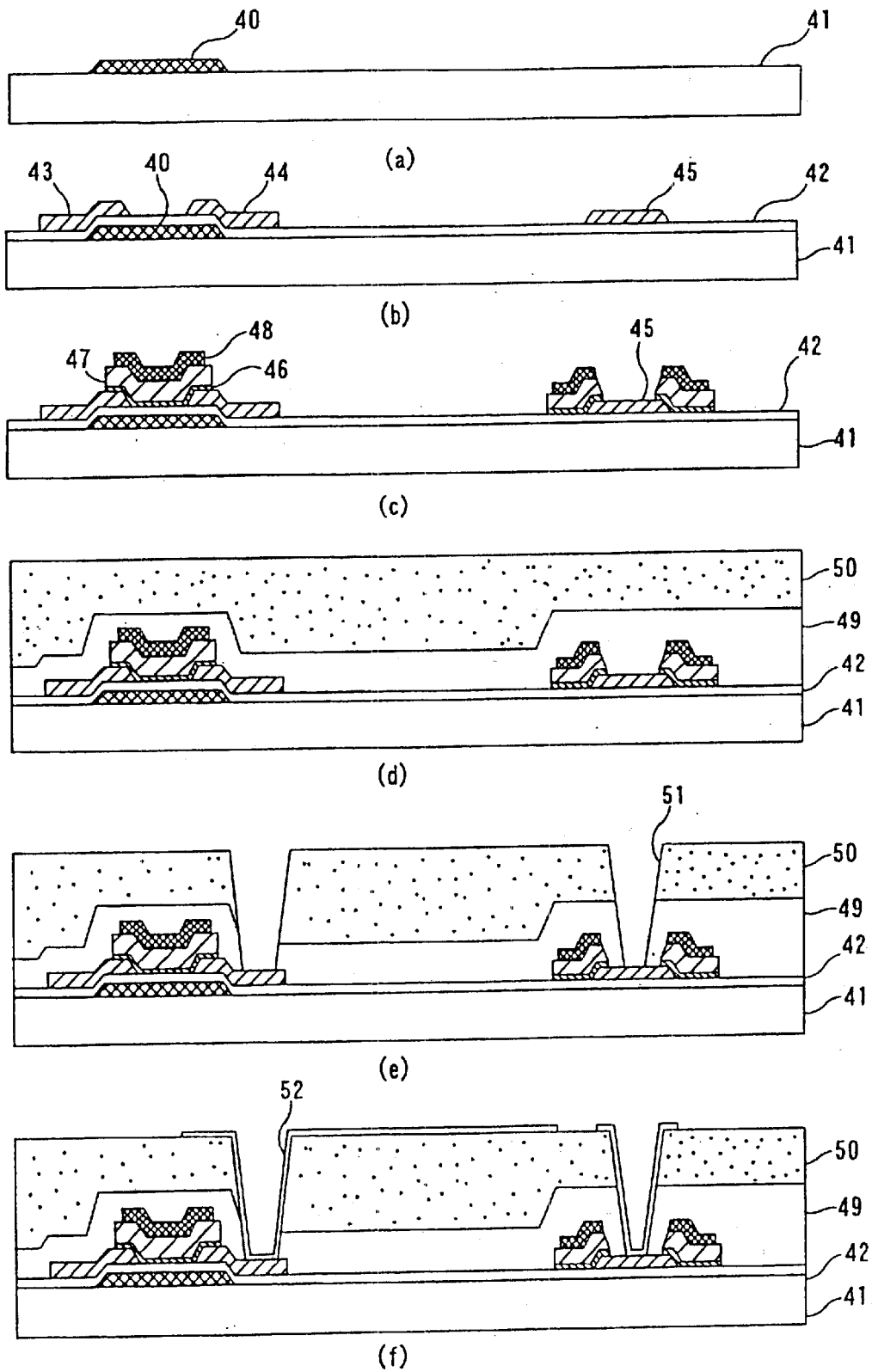
FIGS. 8(a) to 8(f) are drawings showing a second embodiment of a method of manufacturing a TFT of the present invention.

FIGS. 8(a) to 8(f) show another embodiment of the method of manufacturing the TFT of the present invention. The TFT shown in FIGS. 8(a) to 8(f) is constructed as a top gate type transistor, and an interlayer insulating film covers transistor elements including a gate electrode, a gate insulating layer, a source electrode and a drain electrode. In the process shown in FIG. 8(a), a light shielding layer 40 is deposited on a substrate 41, and patterned to a desired pattern. Subsequently, an insulating layer 42 is deposited so as to cover the substrate 41 and the light shielding layer 40, and then a source electrode 43, a drain electrode 44 and a signal wiring 45 are deposited, and patterned as shown in FIG. 8(b).

In the process shown in FIG. 8(c), a semiconductor layer 46, a gate insulating layer 47 and a gate electrode 48 are deposited and patterned, and thus a thin film transistor structure is formed. Thereafter, a passivation layer 49 and an interlayer insulating film 50 are sequentially formed on the constituent components of the TFT as shown in FIG. 8(d).

Subsequently, the interlayer insulating film 50 and the passivation layer 49 are etched by the use of the develop back process of the present invention, and thus a contact hole 51 having an self-aligned inner wall is formed as shown in FIG. 8(e). Thereafter, an ITO layer is deposited and patterned, whereby a pixel electrode 52 is formed. Thus, the top gate type TFT of the present invention can be manufactured as shown in FIG. 8(f).

Figure 9:
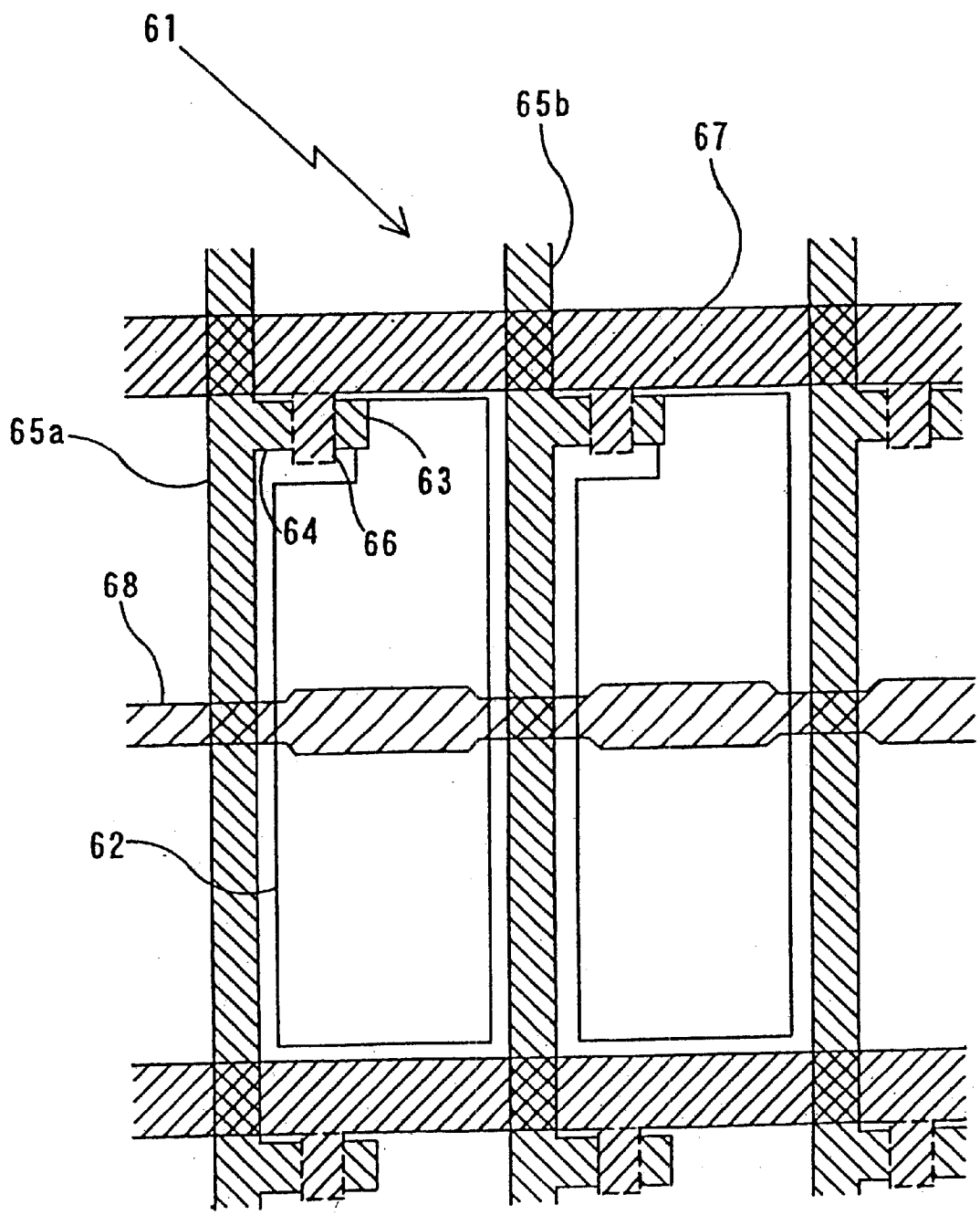
FIG. 9 is a plan view in which a TFT of the present invention is arrayed to form a typical TFT array for a liquid crystal display.
Figure 10:
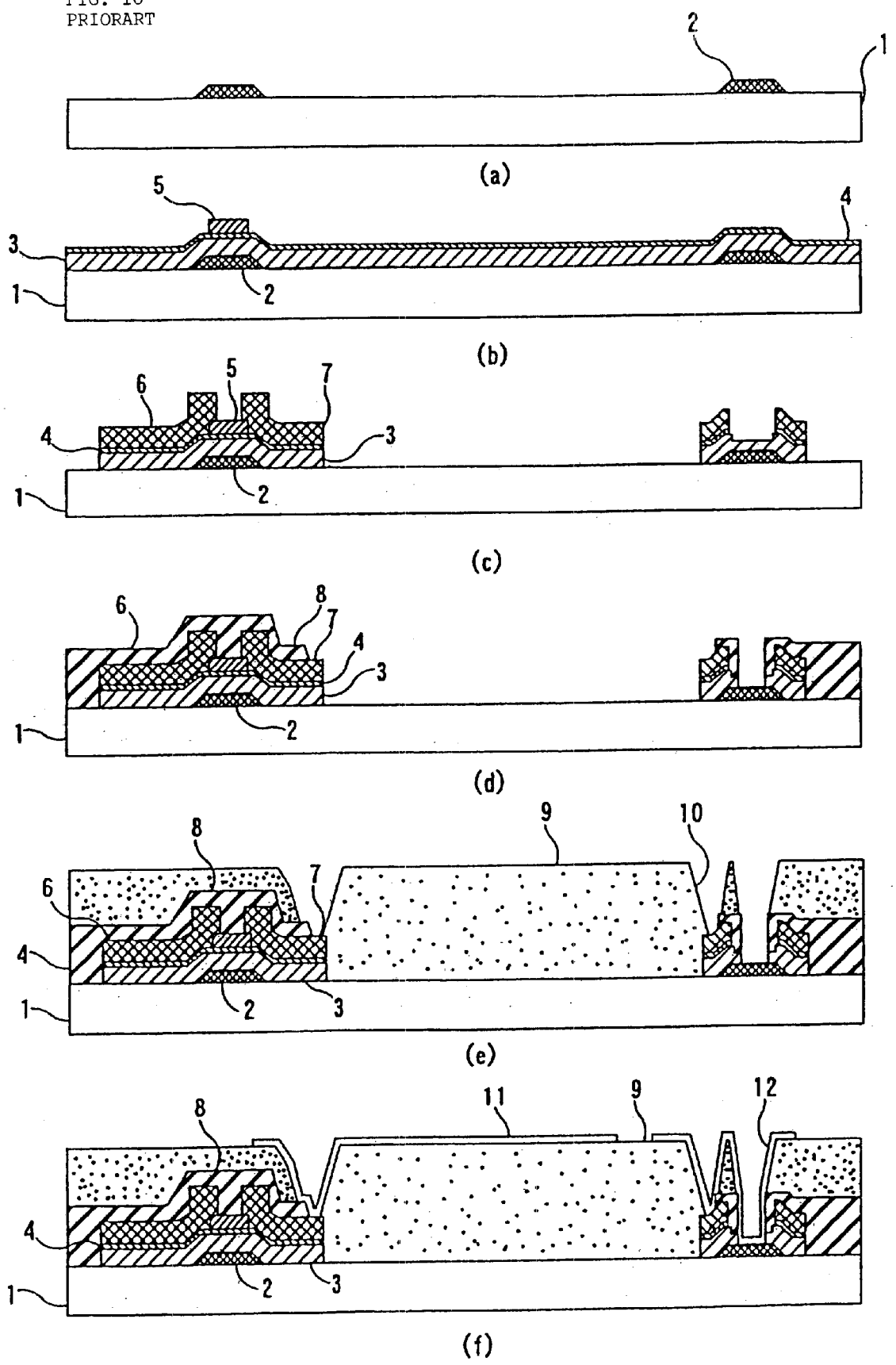
FIGS. 10(a) to 10(f) are drawings showing conventional process steps for manufacturing a TFT including a PFA structure.

FIG. 9 is a plan view in which the TFT manufactured according to the present invention is arrayed to form a typical TFT array for use in a liquid crystal display. As shown in FIG. 9, the TFTs of the present invention are arrayed to constitute a TFT array substrate 61, and a plurality of pixel electrodes 62 are provided on the substrate 61. Although each of the pixel electrodes 62 is formed of ITO in the embodiment described in FIG. 9, the material forming the pixel electrodes 62 is not limited to ITO, and the pixel electrodes 62 can be formed of any suitable material depending on specified application.

A source electrode 63 is connected to the pixel electrode 62, and a drain electrode 64 is connected to a signal wiring 65a. A gate electrode 66 is connected to a gate wiring 67, thus constituting the TFT array. In the embodiment shown in FIG. 9, a capacitance adjusting line 68 is used for adjusting substrate capacitance.

The present invention has been described in relation to a specified embodiment for application to a liquid crystal display device. However, the TFT of the present invention can be used not only for the TFT array of a liquid crystal display device but also for the TFT array of an organic/inorganic electroluminescence display device.

Although the invention has been described with reference to certain preferred embodiments and specific drawings, it will be understood that various modifications, substitutions and enhancements can be made without departing from the true spirit and scope of the invention, which is limited only by the appended claims.

What is claimed is:

1. A method of manufacturing a thin film transistor, the thin film transistor having a gate electrode; a gate insulating film; a semiconductor layer; a source electrode and a drain electrode; a passivation layer and an interlayer insulating film over said passivation layer wherein said method comprises the steps of:

etching a first opening in the interlayer insulating film;

isotropically etching a second opening in the passivation layer wherein said second opening being self-aligned to said first opening; and etching the first opening in the interlayer insulating film a second time so as to flatten an interface between said first opening and said second opening.

2. The method of manufacturing a thin film transistor according to claim 1, wherein a material of said interlayer insulating film is selected from the group consisting of thermoplastic resin, thermosetting resin, photosensitive resin, and mixtures thereof.

3. The method of manufacturing a thin film transistor according to claim 2 wherein said passivation layer comprises an inorganic material.

4. The method of manufacturing a thin film transistor according to claim 3 wherein said inorganic material comprises at least one material selected from the group consisting of silicon nitride, silicon oxide or silicon oxynitride.

5. The method of manufacturing a thin film transistor according to claim 1, wherein said step of etching a first opening is performed with an etchant selected from the group consisting of basic etchant, solvent or combination thereof, said step of isotropically etching a second opening is preformed with an acid etchant and said step of etching the first opening a second time is performed with an etchant selected from the group consisting of basic etchant, solvent or combination thereof.

6. The method of manufacturing a thin film transistor according to claim 5, wherein said step of etching a first opening is performed with an etchant selected from the group consisting of sodium hydroxide, potassium hydroxide, ammonium hydroxide, tetramethyl ammonium hydroxide, tetra-n-butyl ammonium hydroxide, methyl alcohol, ethyl alcohol, isopropyl alcohol and a mixture made of these materials, said step of isotropically etching a second opening is preformed with an etchant containing hydrofluoric acid and said step of etching the opening a second time is performed with an etchant selected from the group consisting of sodium hydroxide, potassium hydroxide, ammonium hydroxide, tetramethyl ammonium hydroxide, tetra-n-butyl ammonium hydroxide, methyl alcohol, ethyl alcohol, isopropyl alcohol and a mixture made of these materials.

7. The method of manufacturing a thin film transistor according to claim 1, wherein said thin film transistor is one of a bottom gate type thin film transistor and a top gate type thin film transistor.

8. The method of manufacturing a thin film transistor according to claim 1, wherein said interlayer insulating film comprises a photosensitive material.

9. The method of manufacturing a thin film transistor according to claim 1, wherein said thin film transistor is fabricated onto a substrate, and said method further comprises manufacturing a plurality of said thin film transistors on said substrate to form a display device.

10. A method of manufacturing a display device including a thin film transistor, said thin film transistor having a gate electrode; a gate insulating film; a semiconductor layer; a source electrode and a drain electrode; a passivation layer and an interlayer insulating film over said passivation layer wherein said method comprises the steps of:

etching a first opening in the interlayer insulating film;

isotropically etching a second opening in the passivation layer wherein said second opening being self-aligned to said first opening; and etching the first opening in the interlayer insulating film a second time so as to flatten an interface between said first opening and said second opening.

* * * * *